(12) United States Patent
Ardenkjær-Larsen (10) Patent No.: US 12,292,487 B2
(45) Date of Patent: May 6, 2025

(54) CLEANING OF A FLUID PATH FOR HYPERPOLARIZATION OF A PHARMACEUTICAL PRODUCT

(71) Applicant: Danmarks Tekniske Universitet, Kgs. Lyngby (DK)

(72) Inventor: Jan Ardenkjær-Larsen, Frederiksberg C (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 875 days.

(21) Appl. No.: 17/436,352

(22) PCT Filed: Mar. 4, 2020

(86) PCT No.: PCT/EP2020/055639
§ 371 (c)(1),
(2) Date: Sep. 3, 2021

(87) PCT Pub. No.: WO2020/178310
PCT Pub. Date: Sep. 10, 2020

(65) Prior Publication Data
US 2022/0163608 A1  May 26, 2022

(30) Foreign Application Priority Data
Mar. 4, 2019 (EP) .................... 19160525

(51) Int. Cl.
*G01R 33/28* (2006.01)
*G01R 33/30* (2006.01)

(52) U.S. Cl.
CPC ........... *G01R 33/282* (2013.01); *G01R 33/30* (2013.01)

(58) Field of Classification Search
None
See application file for complete search history.

(56) References Cited

U.S. PATENT DOCUMENTS

2008/0240998 A1* 10/2008 Urbahn .................. G01N 33/15
422/400
2012/0117985 A1* 5/2012 Urbahn .................. G01N 13/00
137/561 R
(Continued)

FOREIGN PATENT DOCUMENTS

EP          2615471 A1    7/2013
WO     2007136439 A2   11/2007
(Continued)

OTHER PUBLICATIONS

Hövener et al, "Pasadena hyperpolarization of 13C biomolecules: equipment design and installation", Magnetic Resonance Materials in Physics, Biology and Medicine, Chapman and Hall, London, GB, (Dec. 6, 2008), vol. 22, No. 2, ISSN 1352-8661, pp. 111-121, XP019666561, 2016.
(Continued)

*Primary Examiner* — Eric W Golightly
(74) *Attorney, Agent, or Firm* — DINSMORE & SHOHL LLP (57) ABSTRACT

A method is provided for cleaning a reusable fluid path system for hyperpolarization of a pharmaceutical product, the system being continuously at least partly contained by a polarizer. The steps include: providing the polarizer with an inlet tube having a first inlet tube end for fluid contact with a fluid vessel and a second inlet tube end for fluid contact with a vial, for holding the pharmaceutical product; providing the polarizer with an outlet tube having a first outlet tube end for receiving the vial and a second outlet tube end for connecting to a receiving vessel; sealing the second inlet end with the first outlet end; fluidly connecting a medium vessel to the first inlet end; fluidly connecting a collector vessel to the second outlet end; cleaning the path system by transfer-
(Continued)

ring cleaning medium from the vessel into the system; ejecting the cleaning medium; and drying the path system.

16 Claims, 4 Drawing Sheets

(56) References Cited

U.S. PATENT DOCUMENTS

2013/0092192 A1* 4/2013 Pfaffinger .............. A61B 90/70
                                                              134/172
2017/0153263 A1* 6/2017 Mizuki ................... B08B 9/035

FOREIGN PATENT DOCUMENTS

WO    2008137638 A1    11/2008
WO    2014039907 A1    3/2014

OTHER PUBLICATIONS

Malinowski Ronja M et al, "Dissolution Dynamic Nuclear Polarization capability study with fluid path", Journal of Magnetic Resonance, Academic Press, Orlando, FL, US, (Sep. 22, 2016), vol. 272, doi:10.1016/J.JMR.2016.09.015, ISSN 1090-7807, pp. 141-146, XP029766494.
Reynolds Steven et al., "A system for accurate and automated injection of hyperpolarized substrate with minimal dead time and scalable volumes over a large range", Journal of Magnetic Resonance, (2013), XP002798862, 8 pages, 2014.

* cited by examiner

CLEANING OF A FLUID PATH FOR HYPERPOLARIZATION OF A PHARMACEUTICAL PRODUCT

CROSS-REFERENCE TO RELATED APPLICATIONS

This application is the U.S. National Stage of PCT/EP2020/055639 filed Mar. 4, 2020, which claims priority to European Patent Application No. 19160525.2, filed Mar. 4, 2019, the content of both are incorporated herein by reference in their entirety.

FIELD OF THE INVENTION

The present invention relates generally to a method and an apparatus for cleaning of a fluid path system and for hyperpolarizing of a pharmaceutical product using the fluid path system.

BACKGROUND OF INVENTION

Mill is a non-invasive diagnostic technique, which has received widespread use since its development in the 1970s. Today it is standard practice in many hospitals and research labs worldwide for diagnostic medicine and biomedical research. The technique is able to produce a large variety of chemical and physical data.

Compared to other standard diagnostic imaging techniques, such as x-ray imaging, Mill does not involve the use of ionizing radiation, distinguishing it from CT and PET scans.

A drawback with standard Mill and NMR spectroscopy is that the sensitivity is low due to the normally very low degree of polarization of the spin. This leads to long scan time, low resolution and poor image quality. In order to increase the sensitivity a number of techniques have been developed which increases the polarization of the nuclear spin of the imaging agent beyond that of thermal equilibrium.

For a hyperpolarized imaging agent at room temperature, the polarization decreases over time. Consequently, the hyperpolarization is in most cases carried out in close proximity to the patient to decrease the time between hyperpolarization and injection in the patient followed by imaging.

A technique which has been used in order to address the short lifetime of hyperpolarized nuclear spin is dynamic-nuclear polarization (DNP) which relies on spin polarization transfer from electrons to nuclei.

A drawback with current available systems for hyperpolarization by DNP is the significant cost per measurement, acting to limit the use of the technique. Reduced costs of the DNP may allow for a more widespread use.

Reynolds Steven et al. Journal of Magnetic Resonance (2013), "*A system for accurate and automated injection of hyperpolarized substrate with minimal dead time and scalable volumes over a large range*" discloses cleaning of an isolated fluidic arrangement downstream of a receiving vessel, wherein the fluidic arrangement was used for injecting a hyperpolarized product into a subject.

Malinowski et al. Journal of Magnetic Resonance (2016), "*Dissolution Dynamic Nuclear Polarization Capability Study with Fluid path*" discloses a study wherein specific parts of a fluid path system was removed from a hyperpolarizer and cleaned at another location before being refitted to the hyperpolarizer,

SUMMARY OF INVENTION

The present inventor has realized that fluid path systems for hyperpolarization of a pharmaceutical product can be configured in a way which allows for reuse. The reuse of a fluid path system comprises a method for cleaning, such as removal of contaminant, of said fluid path system.

An embodiment of the present disclosure therefore relates to a method for cleaning a reusable fluid path system for hyperpolarization of a pharmaceutical product, said reusable fluid path system being continuously present in the polarizer during multiple consecutive uses; the method comprising the steps of a. providing an inlet tube having a first inlet tube end for fluid contact with a fluid vessel and a second inlet tube end configured for fluid contact with a vial, for holding the pharmaceutical product during hyperpolarization;
b. providing an outlet tube having a first outlet tube end configured for receiving the vial and a second outlet tube end for connecting to a receiving vessel;
c. sealing the second inlet tube end with the first outlet tube end;
d. fluidly connecting a medium vessel to the first inlet tube end;
e. fluidly connecting a collector vessel to the second outlet tube end;
f. cleaning the reusable fluid path system by transferring a cleaning medium from the medium vessel into the reusable fluid path system;
g. ejecting the cleaning medium from the reusable fluid path system into a collector vessel; and
drying the reusable fluid path system.

A large portion of the cost-per-measurements in hyperpolarization is related to the single-use fluid path systems, which are discarded after use. In addition to the different steps associated with the fabrication and assembly of the fluid path system, they further require that the sample vial is attached under clean room conditions in order to minimize the risk of contaminations.

The price per unit as well as the cost related to handling and distribution are significant. Further, logistics and handling of these conventional fluid path systems mean that hyperpolarization measurements often needs to planned way in advance such that fluid path systems are available at the time of the measurement.

Additionally, each step in the fabrication, assembly and handling of the conventional fluid path systems may lead to introduction of contaminants. Contaminants which may pose a significant health risk to a human or an animal subject. If injected together with the polarized pharmaceutical product. Contaminants which typically consists of bacteria and endotoxins, are without proper means of controlling, impossible to prevent. It is therefore logic that the conventional single-use fluid path systems are fabricated, assembled and handled in environments and in such a way as to minimize the introduction of contaminants.

Quality controls of the polarized pharmaceutical product are used to decrease the risk of injecting the measurement subject with an unsafe pharmaceutical product. The quality controls typically relies on sampling a small portion of the product and ensuring that various parameters, such as optical, are within a given range. While the quality control may be able to detect unsafe pharmaceutical products it is typically not able to detect whether the pharmaceutical product is sterile or not sterile. Instead sterility of the final polarized product relies simply on that no contaminants have been introduced to the fluid path system during for example fabrication, assembly, logistics and handling.

As such, an embodiment of the present disclosure targets the cleaning of reusable fluid path systems for hyperpolarization of pharmaceutical products. With the significant demands on sterility of pharmaceutical products to be injected into a subject, an ability to clean the reusable fluid path system immediately prior to use would provide an optimal approach for ensuring a low bioburden of the fluid path system.

By cleaning the fluid path system when contained by the polarizer, there is no risk of the fluid path system being contaminated during fabrication, assembly, logistics and handling. Consequently, by decreasing the distance between polarization of the pharmaceutical product and the cleaning of the fluid path system for polarization of the same, a polarized pharmaceutical product with a lower risk of being contaminated can be achieved.

The lower risk of contaminated pharmaceutical products both decreases the health risk for the measurement subject, but additionally also further lowers the average cost-per-measurement. This is due to having a larger fraction of polarized pharmaceutical products passing the quality control step, saving time and reagents.

Cleaning of the reusable fluid path system may target any kind of contamination, which may be present within or in contact with the reusable fluid path system. It may include biological agents, such as bacteria, but could also comprise residues of chemical compounds from previous hyperpolarization measurements.

The resulting cleanliness of a process directed at decreasing the bioburden of a medical product, is often referred to as the sterility assurance level (SAL). This is the probability that a single unit, such as a reusable fluid path system, that has been subjected to cleaning nevertheless remains non-sterile. As such a lower SAL if preferable for a medical product. The cleanliness, or the SAL, is typically dependent on the chosen cleaning medium, and the cleaning parameters under which the cleaning takes place.

The cleaning medium is preferably chosen such that it is suitable for removing the targeted contaminations and such that it is compatible with the materials of the reusable fluid path system. A common fluid for cleaning medical products is steam, such as by an autoclave. Steam may be generated by providing water combined with heat and/or pressure. Cleaning with steam may cause the reusable fluid path system to be sterilized, wherein all forms of life and/or other biological agents (such as fungi, bacteria, viruses, spore forms, prions, unicellular eukaryotic organisms such as Plasmodium, etc.) present in a specified region, such as a surface, are eliminated, removed, killed, and/or deactivated. Whether a cleaning using steam as the cleaning medium can result in a sterilization, such as having a low SAL, depend on the cleaning parameters. In general a higher temperature, a higher pressure and/or a longer time results in a better cleaning, such as a better sterilization with a lower SAL. Common cleaning parameters for autoclaving by steam sterilization is 121° C. at 200 kPa (approximately 2 bar) pressure for around 10 minutes. Other cleaning parameters for cleaning, such as sterilization, using steam or other cleaning media are known to those skilled in the art.

Another common cleaning media is an ethanol solution, such as 70% ethanol in water, which is a common disinfectant. The cleaning may be carried out at atmospheric pressure, such as around 100 kPa (approximately 1 bar), and at room temperature, such as 25° C.

The cleaning may be carried out with the cleaning medium in liquid phase and/or gas phase, and the cleaning parameters chosen such that an optimal cleaning of the targeted contaminations are achieved.

Having liquid as the cleaning medium may result in a larger shear force applied to the contaminants. Resulting in a displacement of the contaminants, such that they may be removed them from the reusable fluid path system.

The material of the fluid path system may affect the chosen cleaning medium and the cleaning parameters. High temperature of harsh chemicals, such as corrosive chemicals, may not be applicable to all standard materials of fluid path systems. Materials suitable for reusable fluid path systems include, but are not limited to, polyether ether ketone (PEEK), polyamide-imide (PAI), polysulfone, polytetrafluoroethylene (PTFE), polychlorotrifluoroethylene (PCTFE). Other materials, such as polymers, may be suitable for use as reusable fluid path systems, depending on the cleaning medium and the cleaning parameters of the cleaning. Preferably the material have exceptional mechanical, thermal and chemical resistant properties.

The cleaning may further comprise multiple steps, such that an initial cleaning medium is used to remove, eliminate, inactivate and/or kill a certain contaminant while another cleaning medium may be used in a second step, targeting additional contaminants. Depending on the cleaning medium chosen, the cleaning may also comprise removal of a first cleaning medium. Such that a first cleaning medium is removed by flushing with a second cleaning medium, such as water.

The cleaning may further comprise cleaning by other well-known means for achieving clean and/or sterile surfaces, such as the application of sonication while cleaning with a liquid cleaning medium, the application of radiation, such as UV-light. Additional means for cleaning of surfaces for use in medical devices are known to those skilled in the art.

In an embodiment of the present disclosure, the reusable fluid path system is dried following ejecting the cleaning medium into a collector vessel. The drying of the reusable fluid path system may be performed by flushing the reusable fluid path system with a gas until the reusable fluid path system is dry. Additionally, the drying may be carried out by switching, multiple times, between filling the reusable fluid path system with a gas and thereafter evacuating said gas within the reusable fluid path system. During drying by cycling, the second outlet end may be sealed, such that the only fluid connection to the reusable fluid path system is through the pressure port or the vacuum port, when the reusable fluid path system is either filled or evacuated respectively.

An additional embodiment of the present disclosure relates to a method for hyperpolarizing a pharmaceutical product, comprising;
  h. cleaning a reusable fluid path system which is continuously at least partly contained by a polarizer;
  i. fluidly connecting a vessel containing a dissolution medium to the reusable fluid path system;
  j. fluidly connecting a vial containing a pharmaceutical product to the reusable fluid path system;
  k. polarizing the pharmaceutical product;
  l. fluidly connecting a receiving vessel;
  m. reconstituting the pharmaceutical product using the dissolution medium; and
  n. transferring the pharmaceutical product into the receiving vessel.

Methods for achieving hyperpolarization of pharmaceutical products are known to those skilled in the art. The ability to clean a fluid path system for hyperpolarization enables the ability to reuse the fluid path system. For a long time, a significant portion of the cost associated with hyperpolarization of pharmaceutical products are due to the conventional single-use fluid path systems. Cleaning of the fluid path system can enable the ability to reuse the fluid path system multiple times, in the polarization of pharmaceutical products. Consequently, the average cost per polarization may be significantly decreased. Additionally, the ability to clean, such as sterilize, a fluid path system, immediately prior to introducing the sample and polarizing said sample, allows for a cleaner fluid path system, such as the most sterile, such as the lowest SAL, compared to the conventional single-use fluid path system wherein contaminants can be introduced during fabrication, assembly and/or transportation of the fluid path system. The result is that, by performing cleaning of the reusable fluid path system, while it is contained by the polarizer, the risk of having contaminants in the final polarized products is significantly decreased, which subsequently increases the patient safety.

In an embodiment of the present disclosure, the method includes a pressure test of the reusable fluid path system, for ensuring that the reusable fluid path system is suitable for hyperpolarization. This may include filling the reusable fluid path system with gas, at an initial pressure, and thereafter sealing the fluid path system and measuring the pressure change during a specific time interval. If there is no leak, then the pressure is constant throughout the specific time interval, and the fluid path system is suitable for hyperpolarization. The pressure test may be performed before and/or after cleaning a reusable fluid path system. The pressure test ensures that there is no leak of the reusable fluid path system, and that it is suitable for polarization of the pharmaceutical products, as such preferably polarization is only carried out for reusable fluid path systems which have passed the pressure test.

An additional embodiment of the present disclosure relates to a polarizer for hyperpolarizing a pharmaceutical product, accommodating a fluid path system comprising;

o. a reusable fluid path system, being continuously at least partly contained by a polarizer, comprising;
  i. an inlet tube having a first inlet tube end for fluid contact with a fluid vessel and a second inlet tube end configured for fluid contact with a vial, for holding the pharmaceutical product during hyperpolarization;
  ii. an outlet tube having a first outlet tube end configured for receiving the vial and a second outlet tube end for connecting to a receiving vessel;
p. a heater for heating a cleaning medium;
q. a controllable valve system having multiple connection ports, comprising) a pressure port for receiving a high-pressure gas ii) a vacuum port for receiving a low-pressure gas iii) a loading port for receiving media and/or the fluid vessel.

The polarizer is configured such that it can allow for cleaning of a reusable fluid path system, comprising a heater which heats up the cleaning medium and a controllable valve system for introducing media, such as cleaning medium, into, and removing media from, the reusable fluid path system.

The heating of a cleaning medium may take place before, during and/or after the cleaning medium is introduced into the reusable fluid path system.

Preferably, the polarizer comprises a controllable valve system which may be used for introducing fluids into the reusable fluid path system, such as dissolution medium and/or cleaning medium. Additionally the valve system may act to introduce gases into the reusable fluid path system and it may further be used for evacuation of the reusable fluid path system.

The state of the valve system may be manually controlled, but it may further be controlled by a computer system, such that a signal is generated by the computer based on a specific parameter, such as the time elapsed since starting the procedure, wherein the signal may change the state of one or multiple valves of the controllable valve system.

The computer system may further use input from sensors positioned inside, in contact with or outside of the reusable fluid path system in order to form a feedback system. The sensors may further be positioned within the fluid vessel, in contact with the fluid vessel and/or outside the fluid vessel and provide an input signal to the computer system controlling the controllable valve system.

The reusable fluid path system may be reused for multiple hyperpolarization measurements of pharmaceutical products. It may be continuously contained by the polarizer and may not require detachment between different hyperpolarization measurements. It may be designed in a material, which allows it to be reused, such that it can withstand cleaning of one or multiple specific cleaning media and cleaning parameters, such that the cleaning targets the contaminants of interests, such as biological agents.

DETAILED DESCRIPTION OF THE INVENTION

Definitions

A polarizer as used herein refers to an apparatus for hyperpolarization of a pharmaceutical product, such as by dissolution dynamic nuclear polarization.

Hyperpolarization as used herein refers to the nuclear spin polarization of a material in a magnetic field far beyond thermal equilibrium conditions.

A fluid path system as used herein refers to a tube that, following hyperpolarization of a pharmaceutical product, is typically used for transporting a dissolution medium from a point of injection into a vial comprising said hyperpolarized pharmaceutical product such that said pharmaceutical product is dissolved and thereafter transported as part of a solution through an outlet tube into a receiving vessel. Thereby, when used for hyperpolarization of a pharmaceutical product, the fluid path system is fluidly connected to a fluid vessel for injection of the dissolution medium, a vial for containing the pharmaceutical product, and a receiving vessel for receiving the dissolved, hyperpolarized pharmaceutical product. The fluid path system may thereby comprise all fluidic tubing that the dissolution medium and/or the hyperpolarized product comes into contact with during a hyperpolarization experiment. In an embodiment of the present disclosure any of the medium vessel, the vial, the collector vessel and/or the receiving vessel may be connected to the fluid path system during cleaning, and thereby, said vessels and/or vial(s) are also cleaned. It should however be noted that fluidic arrangements downstream of the fluid path system is known to a person skilled in the art. For example fluidic arrangements for transporting the dissolved hyperpolarized pharmaceutical product from a receiving vessel into a subject. These fluidic arrangements may be cleaned by methods disclosed herein, but these fluidic arrangements, although in fluidic contact with the fluid path system, do not form part of the fluid path system.

A fluid path system may typically consist of or comprise an inlet tube having a first inlet tube end for fluid contact with a fluid vessel and a second inlet tube end configured for fluid contact with a vial, for holding the pharmaceutical product during hyperpolarization and an outlet tube having a first outlet tube end configured for receiving said vial and a second outlet tube end for connecting to a receiving vessel.

The present inventor has realized that fluid path systems may be configured in a way that allows for reuse, and furthermore a method by which reusable fluid path systems may be cleaned.

The cleaning of the fluid path system is preferably carried out as the fluid path system is contained by the polarizer during consecutive hyperpolarization experiments, for example the fluid path system may be an integral part of the polarizer, and thereby not meant to be removed, unless for example it is broken and in need of replacement.

By the use of reusable fluid path systems, significant costs and logistics related to replacement of single-use fluid paths can be avoided, and furthermore the reusable fluid path systems can be ensured to be clean, such as sterile, at the time of use as a cleaning routine may be performed as an initiating step of a hyperpolarization experiment.

An embodiment of the present disclosure therefore relates to a method for cleaning a reusable fluid path system for hyperpolarization of a pharmaceutical product, said reusable fluid path system being continuously present in the polarizer during multiple consecutive uses; the method comprising the steps of r. providing an inlet tube having a first inlet tube end for fluid contact with a fluid vessel and a second inlet tube end configured for fluid contact with a vial, for holding the pharmaceutical product during hyperpolarization;

s. providing an outlet tube having a first outlet tube end configured for receiving the vial and a second outlet tube end for connecting to a receiving vessel;

t. sealing the second inlet tube end with the first outlet tube end;

u. fluidly connecting a medium vessel to the first inlet tube end;

v. fluidly connecting a collector vessel to the second outlet tube end;

w. cleaning the reusable fluid path system by transferring a cleaning medium from the medium vessel into the reusable fluid path system;

x. ejecting the cleaning medium from the reusable fluid path system into a collector vessel; and y. drying the reusable fluid path system.

Preferably the steps above are performed in the order in which they are listed, although any order of the steps is possible.

In an embodiment of the present disclosure the polarizer may be provided with an inlet tube having a first inlet tube end for fluid contact with one or multiple fluid vessels which may provide fluids, such as liquids, and a second inlet tube end configured for fluid contact with a vial, for holding the pharmaceutical product during hyperpolarization.

Following hyperpolarization the pharmaceutical product may be reconstituted such that a hyperpolarized solution is yielded. The hyperpolarized solution may enter an outlet tube through a first outlet tube end and exit the reusable fluid path system through a second outlet tube end.

For cleaning the fluid path system, the second outlet tube end may be sealed with the first outlet tube end, forming a fluid connection, such as a hermetic connection, such as having a hermetic seal between the second inlet tube end and the first outlet tube end.

A medium vessel containing medium may be fluidly connected to the first inlet tube end such that it forms a fluid connection, such as a hermetic connection. Fluid may consequently be transferred from the fluid vessel into the reusable fluid path system. A collector vessel may be fluidly connected to the second outlet tube end, such that it forms a fluid connection, such as a hermetic connection. Fluids, such as the cleaning medium, may consequently be transferred into the collector vessel from the reusable fluid path system.

In an embodiment of the present disclosure, cleaning of the reusable fluid path system may be carried out by transferring, at least a part of, the cleaning medium from the medium vessel into the reusable fluid path system. Surfaces of the fluid path system being in contact with the cleaning medium for a specific time, such that said surfaces become clean, such as sterile.

In an embodiment of the present disclosure, the cleaning comprise a first and a second cleaning medium, wherein the first cleaning medium targets the contamination of the reusable fluid path system. The second cleaning medium may, following ejecting the first cleaning medium into the collecting vessel, be used to remove the first cleaning medium from the reusable fluid path system. The use of multiple cleaning media, such as a first and a second, may be useful in the case where the first cleaning medium, targeting the contaminants, is a harsh chemical, or a chemical which may leave precipitations during drying. The second cleaning medium may therefore be targeting the removal of parts of the first cleaning medium. Additional cleaning media, such as a third may be used, such that the combined cleaning of a first cleaning medium, followed by a second cleaning medium and followed by any further cleaning media is advantageous than just having a single cleaning medium.

At least a part of the cleaning medium may thereafter be transferred into the collector vessel from the reusable fluid path system, such as ejecting the cleaning medium from the reusable fluid path system to the collector vessel. After the ejection of the cleaning medium from the fluid path system, parts of the cleaning medium may still not have been successfully ejected. In order to target residues of cleaning medium being left in the reusable fluid path system, the fluid path system may need to be dried. The drying may comprise flushing the reusable fluid path system with a gas, such as air and/or helium, additionally it may comprise switching between filling a sealed, such as by sealing the second outlet end, reusable fluid path system and evacuating said reusable fluid path system.

After contaminations may have been removed, any remaining cleaning medium needs to be removed. The reusable fluid path system is thereafter dried, at least partly, before polarization of a pharmaceutical product.

In an embodiment of the present disclosure the cleaning further comprises a pressure test of the reusable fluid path system, such as a hydrostatic test. The pressure test may be carried out; i. before the cleaning of the reusable fluid path system by introducing cleaning medium to the reusable fluid path system; ii. before drying the reusable fluid path system; iii. after the drying of the reusable fluid path system; and/or iv. after the pharmaceutical product is added to the fluid path system.

The pressure test may comprise applying an initial pressure to the reusable fluid path system and sealing the reusable fluid path system. The pressure may stem from a pressurized gas, e.g. helium, which is introduced into the reusable fluid path system before sealing said reusable fluid path system. A pressure sensor, such as a manometer, may provide a reading of the pressure in the reusable fluid path system, such as the pressure of the pressurized gas. The pressure in the reusable fluid path system may be measured for a specific time period, and a pressure change may be detected during said specific time period. The pressure test may further comprise a pass or fail criterion wherein the reusable fluid path system passes the pressure test if there is no pressure change or if the pressure change is below a specific tolerance value, such as less than 2%, more preferably less than 1% more preferably less than 0.5%, most preferably 0%.

Preferably, a reusable fluid path system is only used for polarization if it passes the pressure test. In an embodiment of the present disclosure, the pressure test is carried out at a specific temperature, such as at 25° C.

In an embodiment of the present disclosure, the fluid path system is left, after performing a cleaning and/or a pressure test, with either vacuum or e.g. helium gas to provide a non-viable environment for bacterial growth.

In an embodiment of the present disclosure, connections and/or seals to and/or from the reusable fluid path system and/or between parts of the reusable fluid path system may be hermetic connections and/or hermetic seals. A hermetic seal is a seal that makes a given object airtight, such that it excludes the passage of gas, such as air and oxygen. Various ways of achieving hermetic seals are known to those skilled in the art. They may be formed using a connector, such as a gasket or an O-ring between the connecting parts. The connector may be fabricated in an elastomer or a polymer such as a fluoropolymer, such as polytetrafluoroethylene (PTFE). Additional means for achieving a hermetic seal include PTFE sealing rings, PTFE sleeves, PTFE tape, PTFE resin strings, and wax. Appropriate methods for achieving a hermetic seal may be chosen such that contaminants from the seal itself is not introduced into the reusable fluid path system.

In an embodiment of the present disclosure, the reusable fluid path system after cleaning meets the governmental requirements, such as ISO 14937, ISO 11135, ISO 11737, ISO 17665, ISO 11138 and/or ISO 10993. Wherein the purpose of cleaning, such as sterilization, may be to inactivate the microbiological contaminants and thereby to transform a non-sterile reusable fluid path system into a sterile one. The term bioburden may be used to describe the population of viable microorganisms present on or in a product and/or a sterile barrier system.

The kinetics of inactivation of a pure culture of microorganisms by physical and/or chemical agents used to sterilize health care products may be best described by an exponential relationship between the numbers of microorganisms surviving and the extent of treatment with the cleaning medium. Inevitably, this means that there may always be a finite probability that a microorganism can survive regardless of the extent of the cleaning conditions. For given cleaning conditions, the probability of survival may be determined by the number and resistance of microorganisms and by the environment in which the microorganisms exist during treatment. It follows that the sterility of any one product in a population subjected to sterilization processing cannot be guaranteed and the sterility of a processed population is defined in terms of the probability of there being a viable microorganism present on a product item. Often the sterility assurance level (SAL) is given as a measure of the risk of a non-successful sterilization of a medical product.

Preferably, the cleaning of the reusable fluid path system is carried out such that the cleaned reusable fluid path system has a low bioburden, such as being sterile. The cleaning medium and the cleaning conditions may be selected such that the cleaning targets bacteria. The cleaning condition may further be such that the resulting bioburden is significantly low, wherein the colony forming units (CFU) of the reusable fluid path system is less than 100, more preferably less than 50, even more preferably less than 10, most preferably less than 5. Further, the inside of the reusable fluid path system may have a significant low bioburden, such as less than 20 CFU, more preferably less than 10 CFU, even more preferably less than 5 CFU, most preferably less than 3 CFU. Various approaches for cleaning of surfaces, to achieve sterile surfaces, are known to a person skilled in the art.

In an embodiment of the present disclosure, a terminal sterile filter is added to the outlet tube to decrease, such as eliminate, any remaining bioburden.

Cleaning Conditions

In an embodiment of the present disclosure the cleaning medium and a number of cleaning parameters, such as a minimum cleaning temperature, a minimum cleaning pressure and/or a minimum cleaning time, is chosen such that a majority of the targeted biological agents, such as bacteria, can be assumed to be eliminated, removed, killed and/or deactivated.

The fluid path system may be of a material that withstands specific cleaning medium and/or cleaning parameters, such as high temperatures, harsh chemicals (e.g. corrosive). The material of the fluid path system may thereby affect the chosen cleaning medium and the cleaning parameters. High temperature of harsh chemicals, such as corrosive chemicals, may not be applicable to all standard materials of fluid path systems. Materials suitable for reusable fluid path systems include, but are not limited to, polyether ether ketone (PEEK), polyamide-imide (PAI), polysulfide, polytetrafluoroethylene (PTFE), polychlorotrifluoroethylene (PCTFE). Other materials, such as polymers, may be suitable for use as reusable fluid path systems, depending on the cleaning medium and the cleaning parameters of the cleaning. Preferably the material have exceptional mechanical, thermal and chemical resistant properties, such that it can withstand the cleaning medium and the cleaning parameters.

Following cleaning the reusable fluid path system preferably has a low bioburden, such that it is suitable for hyperpolarization of pharmaceutical products, such as compounds targeted for injection to a patient. Different combinations of cleaning media and cleaning parameters, for achieving clean surfaces fabricated in materials suitable for fluid path systems, are known to those skilled in the art. Additionally, combinations of cleaning media and cleaning parameters, for achieving sterile surfaces fabricated in materials suitable for fluid path systems, are known to those skilled in the art.

Cleaning may comprise various levels of cleanliness, and may further target the removal of particles or preventing biological activity of biological agents. Optimal cleaning may be when all particles, biological and non-biological are removed. Surfaces of a reusable fluid path system for polarization of a pharmaceutical products comprising particles may still be suitable for use, however, the surfaces may still be required to be sterile, and as such deactivated biological agents may be acceptable.

Additionally, cleaning may comprise the deactivation, removal, elimination and/or killing of all forms of life and/or biological agents, for example such that they do not pose a threat to a human if injected. Biological agents may comprise, but are not limited to fungi, bacteria, viruses, spore forms, prions and unicellular eukaryotic organisms. In order to achieve a sterile environment all forms of life and other biological agents needs to be eliminated, removed, killed and/or deactivated.

Multiple ways of achieving a clean surface, such as a low bioburden surface, such as a sterile surface, are known to those skilled in the art. A widely used method for sterilization of medical equipment is by steam sterilization, such as by an autoclave. Various conditions for steam sterilization exists and depend on the targeted contamination, typically the steam is heated to 121-134° C. (250-273° F.) under pressure. To achieve sterility using steam sterilization, the reusable fluid path system, may be heated by injected steam until the article reaches a specific temperature, and will be subjected to the steam for a specific time. Almost all the air may be removed, because air is typically undesired in the moist heat sterilization process. The reusable fluid path system may be held at the specific temperature for a specific time, which varies depending on what bioburden is present on the reusable fluid path system and its resistance (D-value) to steam sterilization. A general cycle would be anywhere between 3 and 15 minutes, depending on the generated heat, at 121° C. (250° F.) at 100 kPa (15 psi). Such condition may be sufficient to provide a sterility assurance level of $10^{-4}$ for a product with a bioburden of $10^6$ and a D-value of 2.0 minutes.

Typically cleaning of a surface for removal of biological compounds, such as sterilization, is given a sterility assurance level (SAL) referring to the probability that a single unit that has been subjected to sterilization nevertheless remains nonsterile. The SAL depends on the cleaning conditions, such as the cleaning medium, the cleaning temperature, the cleaning pressure and the cleaning time.

In an embodiment of the present disclosure the cleaning medium is in liquid and/or in gas phase, and selected from the group of water, bleach, chlorine, ethylene oxide, an aldehyde, a halogen-based biocide, a quaternary ammonium compound, a phenol, an acid solution, an alkali solution, a heavy metal solution, a solution containing surfactants, an alcohol, such as 70% ethanol in water, or a combination thereof. Additional cleaning media are known to those skilled in the art.

For steam sterilization, the cleaning medium may be water heated above its boiling point, such that it forms steam. The boiling temperature being dependent on the pressure. Another common cleaning medium typically used for cleaning surfaces is 70% ethanol, which acts as a disinfectant for removing biological agents. The process by which biological agents are removed differs between different cleaning media and/or cleaning conditions. For steam sterilization, the bio agents are mainly killed by the denaturation of macromolecules, primarily proteins. Ethanol may instead primarily kill organisms by denaturing their proteins and dissolving their lipids. Ethanol is generally considered to be effective against most bacteria, fungi, and many viruses but in general relatively ineffective against bacterial spores.

Consequently, the cleaning conditions, including the cleaning medium, needs to be chosen such that the targeted contamination can be removed, killed, eliminated and/or inactivated. Sterilization agents may be used as part of a cleaning medium, such as steam. Additionally, disinfectants may be used as part of a cleaning medium, such as 70% ethanol. Further, antiseptics may be used as part of a cleaning medium. Even further, antibiotics may be used as part of a cleaning medium.

In an embodiment of the present disclosure, the cleaning medium is heated to a specific temperature. Depending on the cleaning medium used, its cleaning potential may be increased while heated. Consequently, an embodiment of the present disclosure is related to heating of the cleaning media, such as above room temperature. The cleaning medium being heated to at least 70° C., more preferably at least 90° C., even more preferably at least 110° C., most preferably at least 140° C. The temperature is preferably compatible with the polarizer, such as the material of the reusable fluid path system and the cleaning medium/media.

The heating of water may generate steam as a cleaning medium in a preferred embodiment of the present disclosure. The cleaning medium may further be pressurized to a specific pressure, such as at least an absolute pressure of 2 bar, more preferably at least an absolute pressure of 7 bar, even more preferably at least an absolute pressure of 12 bar, most preferably at least an absolute pressure of 16 bar. The pressure being chosen in combination with the temperature to suit the reusable fluid path system, the polarizer, the cleaning medium and the targeted contamination.

In an embodiment of the present disclosure, at least a part of the cleaning medium is positioned within the reusable fluid path system for a certain time, such as at least 1 minute, more preferably at least 5 minutes, even more preferably at least 10 minutes, most preferably at least 15 minutes. Preferably, the cleaning medium is in contact with all parts of the reusable fluid path system for a minimum amount of time.

The cleaning of the reusable fluid path system, may further, as previously mentioned, comprise a second, or further, cleaning medium/media. Wherein the additional cleaning media is targeting the removal of parts of the previous cleaning media, such as precipitations.

Therefore, in a preferred embodiment of the present disclosure, the cleaning of the reusable fluid path is carried out in a way for ensuring a low bioburden, such as substantially sterile, such as sterile, of said reusable fluid path system. A cleaned reusable fluid path system, may thereby be reused without a risk of introducing contaminants, such as biological particles, e.g. bacteria, into a subject, during a subsequent hyperpolarization experiment. Furthermore, cleaning may be carried out to remove substances used in a previous hyperpolarization experiment, such as a dissolution medium and/or an active pharmaceutical ingredient. In one embodiment of the present disclosure the fluid path system is configured for fluid contact with a subject, such that a hyperpolarized product can be directly injected into said subject. It may thereby be a preference that also parts in addition to the fluid path system is cleaned, such as a fluidic arrangement for introducing a hyperpolarized product into a subject. This may allow for cleaning of an entire fluidic arrangement, comprising the fluid path system, wherein cleaning of said fluidic arrangement comprises cleaning of all surfaces that the dissolution medium and/or the active pharmaceutical ingredient/hyperpolarized product may come into contact with in connection with a hyperpolarization experiment. The fluidic arrangement may further comprise pumps, connectors, adapters, syringes, filters, tubes, and/or needles. Preferably the fluidic arrangment comprise all components required for dissolution of a hyperpolarized product, (optionally) filtering said product, and injection at least a part of said dissolved product into a subject.

In a preferred embodiment of the present disclosure the cleaning comprise chemical cleaning, such as removal of hyperpolarized product, acid, base, buffer, and biological cleaning, such as removal of biological material and/or bacterial growth is eliminated. Thereby it is a preference that, following cleaning, the fluid path system, chemically, biological and particulate clean. Therefore, the cleaning is preferably configured for chemical, biological and/or particulate cleanliness.

Second Cleaning

In an embodiment of the present disclosure, the method comprises a second cleaning step, which may be carried out before cleaning the reusable fluid path system, after cleaning the reusable fluid path system and/or after drying the reusable fluid path system. The second cleaning step may comprise cleaning of outer surfaces of the reusable fluid path system and/or the contacting parts, such as contacting parts of the fluid vessel, the collector vessel, the receiving vessel and/or the medium vessel.

The cleaning conditions of the second cleaning may be similar to the cleaning conditions of the cleaning of the reusable fluid path system. Preferably the cleaning medium of the second cleaning is in liquid and/or in gas phase and selected from the group of water, bleach, chlorine, ethylene oxide, an aldehyde, a halogen-based biocide, a quaternary ammonium compound, a phenol, an acid solution, an alkali solution, a heavy metal solution, a solution containing surfactants, an alcohol, such as 70% ethanol in water, or a combination thereof. Additional cleaning agents are known to those skilled in the art, such as sterilizing agents, disinfectants, antiseptics and antibiotics.

Drying

In an embodiment of the present disclosure, the reusable fluid path system is at least partly dried. The drying may comprise flushing a gas, such as air, nitrogen or helium through the reusable fluid path system. The gas may be continuously purged through the reusable fluid path system. Liquids remaining within the reusable fluid path system, such as part of the cleaning medium, may evaporate and be transferred out of the reusable fluid path system by the gas. The gas may be collected at an outlet end of the polarizer, such as of the reusable fluid path system, such as the second outlet end.

In an additional embodiment the drying of the reusable fluid path system is generated by cycling between filling the reusable fluid path system with a gas, such as air, nitrogen or helium, and evacuating said gas from the reusable fluid path system. Liquids remaining in the reusable fluid path system may evaporate into the gas, which subsequently is evacuated from the reusable fluid path system. The number of cycles may be chosen such that it is highly likely that any remaining liquid is evaporated and/or transferred out of the reusable fluid path system.

Additionally, the reusable fluid path system may be connected to a low-pressure source, such as a pump for vacuum drying of the reusable fluid path system. Other means of drying may comprise osmotic dehydration followed by heat pump drying and microwave-vacuum drying.

Drying may be combined with a drying temperature and/or a drying pressure, such that the drying process is optimized, such that it is faster. If the drying temperature is higher, liquids may evaporate faster. If the drying pressure is a low pressure, such as an absolute pressure of 0.003-0.006 bar, the evaporation may be faster. Typically at these pressures, water has a boiling point of around 25-30° C.

The gas for drying the reusable fluid path system may be sterile filtered, such as to not introduce any contaminants into the system. The sterile filtration may be carried out by having the gas pass through a 0.2 µm membrane sterile filter.

Fluid Path System

The fluid path system is preferably configured such that a frozen hyperpolarized material can be rapidly and completely dissolved. It is also desirable that the dissolved material be fully displaced from its initial location to a final location in order to ensure suitable pH levels, active pharmaceutical ingredient concentration, and liquid state polarization in the injectable solution. Furthermore the fluid path system is preferably configured such that it can be cleaned by a suitable cleaning medium at suitable cleaning parameters, thereby the fluid path system should be able to withstand the corresponding temperatures, pressures and pH levels.

The fluid path system should also provide maintained sterility during dissolution and transport of the material in a cost-effective and efficient manner.

The fluid path system should preferably provide for rapid and complete dissolution of a frozen hyperpolarized material and transport the resulting hyperpolarized solution from its initial location within a polarizer system to a final location outside the polarizer system for use (e.g., injection into a patient). The fluid path system should thereby preferably comprise or consist of tubes configured such that a dissolution medium (and/or a cleaning medium) can be injected at one end of said fluid path system and wherein said dissolution medium (and/or a cleaning medium) can be transported through the fluid path system towards an outlet end of said fluid path system. A dissolution medium may dissolve a hyperpolarized product while a cleaning medium may clean the fluid path system.

The fluid path system may comprise a vial to contain a pharmaceutical, an inlet tube having an output end in fluid communication with the vial and an input end in fluid contact with one or more pressure vessels to contain a dissolution medium and/or a cleaning medium, and an outlet tube having a first end hermetically attached to the vial to transport a mixture of dissolved pharmaceutical product and dissolution medium, or the cleaning medium. The inlet tube and outlet tube may be tubular structures and the inlet tube may be positioned internal to or parallel to the delivery fluid path system. The fluid path system may additionally comprise a receiving vessel connected to a second end of the outlet tube to receive the mixture, an inlet tube valve and an outlet tube valve to control flow, a filter cartridge integrated within the outlet tube to remove at least one of an electron paramagnetic agent (EPA) and a processing agent from the hyperpolarized solution before entering the receiving vessel. The polarizer may comprise a sliding seal unit for being positioned between the pressure vessel and the vial to seal a cryogenically cooled chamber containing the vial from an ambient environment without contacting contents of the vial. The sliding seal unit may bisect the inlet tube and outlet tube and may be capable of traversing the length of the fluid path systems.

The fluid path system may be made from medical grade materials if used in a clinical setting for preparing and delivering an injectable solution to patients. Such materials are known and are generally plastics of validated quality in terms of leachable and stability. The materials for the fluid path system are further selected on the basis of their thermal, mechanical, and chemical properties to be compatible with the product and environment (cryogenic and superheated temperatures, as well as high pressures). The fluid path system is designed to provide a sterile barrier to the sample and resulting solution and all assemblies and parts therein are designed to prevent the user from unintentionally breaking the barrier.

While the fluid path system may comprise an inner tube and an outer tube, it is also envisioned that other configurations can also be implemented. The fluid path system may be configured to have an inlet fluid path and an outlet fluid path positioned in a parallel arrangement. In such an arrangement it is understood that the sliding seal is capable of traversing the length of both the outlet tube and the inlet tube, as both bisect the sliding seal unit. Inlet tube is in fluid communication with the vial or seal to transfer dissolution medium from a medium vessel into the vial to dissolve sample. Outlet tube is sealed to vial to transfer a mixture of the dissolution medium and dissolved sample out from the vial or seal in the form of a hyperpolarized solution to be delivered to a receiving vessel as desired. During cleaning Inlet tube is in fluid communication with the vial or seal to transfer cleaning medium from a medium vessel into the vial. Outlet tube is sealed to vial to transfer the cleaning medium from the vial or seal to a collector vessel.

Therefore, according to one embodiment of the present invention, a fluid path system may comprise an inlet tube having an output end in fluid communication with the vial or seal and an input end in fluidic contact with one medium vessel containing a cleaning medium or multiple medium vessels, such as two containing cleaning medium and dissolution medium respectively, and an outlet tube having a first end hermetically attached to the vial or seal to transport therefrom the cleaning medium or a mixture of dissolved pharmaceutical product and dissolution medium.

Polarization

A further embodiment of the present disclosure relates to a method for hyperpolarizing a pharmaceutical product. The method comprises cleaning of a reusable fluid path system, which is continuously at least partly contained by a polarizer. The cleaning may be carried out prior to introducing a pharmaceutical product to be polarized into the system, but may alternatively or additionally be carried out after receiving the polarized pharmaceutical product, such as when the polarized pharmaceutical product is ejected from the polarized into a receiving vessel.

The method may further comprise a vessel for containing a dissolution medium. Said vessel may be fluidly connected to the reusable fluid path system. Preferably, a vial containing the pharmaceutical product is connected to the reusable fluid path system. Wherein the vial may contain additional components used during hyperpolarization, such as an electron paramagnetic agent, as known to those skilled in the art. Following hyperpolarization of the pharmaceutical product it may be reconstituted by the dissolution medium, which commonly is heated to an elevated temperature.

The dissolution medium may be injected into the reusable fluid path system such that it flows through the inlet tube to the polarized pharmaceutical product. The reconstituted hyperpolarized pharmaceutical product may be transferred to a receiving vessel, which may be fluidly connected to the second outlet tube end.

The cleaning of the reusable fluid path system preferably results in no contamination stemming from previous pharmaceutical products which may have been polarized. Consequently, it may be possible to hyperpolarize different chemical compounds within the same reusable fluid path system, and further, the dosage may be better controlled.

The cleaning may be performed before introducing the pharmaceutical product to be polarized to the reusable fluid path system, but it may also, or additionally, be carried out following the ejection of the polarized pharmaceutical product from the reusable fluid path system.

The hyperpolarization of a pharmaceutical product may be combined with a pressure test, such that hyperpolarization is only carried out using a reusable fluid path system which has passed the pressure test. Sterile filters may be used in order to further ensure the sterility of the final product. Such that the receiving vessel may contain a sterile filter, such as a 0.2 μm pore size membrane sterile filter. Additionally, the dissolution medium may be sterile filtered prior to coming into contact with the pharmaceutical product.

In an additional embodiment of the present disclosure the polarization of a pharmaceutical product may be carried out in a laminar airflow of filtered air, such as being filtered by high efficiency particulate air (HEPA), in order to reduce the risk of introducing contaminants. The laminar airflow of filtered air may surround the entire polarizer such that a controlled environment around the polarizer is generated.

In an additional embodiment of the present disclosure the polarization of a pharmaceutical product may be carried out under UV light, in order to kill any microorganisms that enter during operation of the polarizer. Outer surfaces of the polarizer may be cleaned, such as sanitized, according to known principles.

Preferably, the hyperpolarized pharmaceutical product is tested according to multiple control parameters, in order to carry out a quality control of the final product. These tests are known to those skilled in the art and may comprise optical measurements of the sample, in order to ensure a high quality product suitable for injection into a patient.

A Polarizer

An additional embodiment of the present disclosure relates to a polarizer for hyperpolarizing a pharmaceutical product. The polarizer accommodating a fluid path system may comprise a reusable fluid path system, being continuously at least partly contained by a polarizer. The reusable fluid path system may be permanently positioned in the polarizer. Additionally, the reusable fluid path system may be permanently comprised by the polarizer. The reusable fluid path system may be suitable for being reused for multiple polarizations of pharmaceutical products, such as at least 2, more preferably at least 5, even more preferably at least 10, most preferably at least 20. Additionally, the reusable fluid path system may be detachable from the polarizer, such that it may be serviced and/or replaced. In one embodiment of the present disclosure the reusable fluid path system is continuously present in the polarizer during multiple consecutive uses, such as at least 2 consecutive uses, more preferably at least 5 consecutive uses, even more preferably at least 10 consecutive uses, most preferably at least 20 consecutive uses. In another embodiment of the present disclosure the reusable fluid path system is permanently present in the polarizer, such as during any consecutive uses. In one embodiment of the present disclosure the fluid path system is an integral part of the polarizer. Preferably said integral fluid path system is permanently mounted to the polarizer. It may thus be a preference that the fluid path system is not detachable from the polarizer.

The reusable fluid path system may be held in place by parts of the polarizer, such as a positioning system and/or a pressure/heater module, which are known to those skilled in the art.

Parts of the reusable fluid path system, such as the parts for receiving the vial holding the pharmaceutical product and/or the vial, may be transferred into a position where the conditions, such as temperature and magnetic field strength, are suitable for hyperpolarization. Parts of the reusable fluid path system may consequently be moved between compartments and/or sections of the polarizer, but may continuously make contact with at least parts of the polarizer. The reusable fluid path system may be contacted by the polarizer without interruption during multiple consecutive hyperpolarization measurements. The reusable fluid path system may further be permanently positioned within the polarizer. Additionally, the reusable fluid path system may be permanently in contact with the polarizer. Further, the reusable fluid path system may be continuously or permanently contained by or contained within the polarizer, or contacted by parts thereof. The reusable fluid path system may be used in multiple hyperpolarization measurements. In an embodiment of the present disclosure, the reusable fluid path system is repositioned between hyperpolarization measurements. Preferably, the reusable fluid path system is repeatedly used for hyperpolarization measurements. In a preferred embodiment, the reusable fluid path system is in constant contact with the polarizer, such as parts of the polarizer assembly, during multiple consecutive hyperpolarization measurements.

The reusable fluid path system may comprise a dynamic seal, which is used in order to maintain vacuum conditions and/or low temperature conditions within parts of the polarizer. The reusable fluid path system may comprise parts, such as the inlet tube and/or the outlet tube, which may bisect the dynamic seal and allow the inlet and/or the outlet tube to traverse the dynamic seal while maintaining temperature and/or pressure conditions in parts of the polarizer.

The reusable fluid path system preferably comprises an inlet tube having a first inlet tube end for fluid contact with a fluid vessel and a second inlet tube end configured for fluid contact with a vial, for holding the pharmaceutical product during hyperpolarization. Additionally the reusable fluid path system may comprise an outlet tube having a first outlet tube end configured for receiving the vial and a second outlet tube end for connecting to a receiving vessel.

The reusable fluid path system may further comprise a heater for heating a cleaning medium and a controllable valve system having multiple connection ports, comprising; i) a pressure port for receiving a high pressure gas ii) a vacuum port for receiving a low pressure gas iii) a loading port for receiving media and/or the fluid vessel.

The heating of the cleaning medium may be carried out before, during and/or after introducing the cleaning medium into the reusable fluid path system. In an embodiment of the present disclosure, the heater for heating the cleaning medium may be the same heater as for heating the dissolution medium.

In an embodiment of the present disclosure, the reusable fluid path system may be detachable from the polarizer, such that the reusable fluid path system can be replaced or serviced. The reusable fluid path system may therefore be able to be detached from the polarizer. Additionally, parts of the reusable fluid path system may be individually detached from the polarizer. When individual parts of the reusable fluid path system is detached, other parts of the reusable fluid path system may still be contained or in contact or connected to parts of the polarizer assembly.

In an embodiment of the present disclosure, the reusable fluid path system comprises a secondary controllable valve system, switchable between an open and a closed state. The open state comprises a fluid connection between the first inlet tube end and the second inlet tube end, and a fluid connection between the first outlet tube end and the second outlet tube end. In the closed state, a valve prevents flow in the inlet tube and the outlet tube, while forming a fluid loop between the first outlet end and the second inlet end.

In an additional embodiment of the present disclosure the polarization of a pharmaceutical product may be carried out in a laminar airflow of filtered air, such as being filtered by high efficiency particulate air (HEPA), in order to reduce the risk of introducing contaminants. The laminar airflow of filtered air may surround the entire polarizer such that a sterile environment around the polarizer is generated.

Controllable Valve System

Preferably, the polarizer comprises a controllable valve system. The controllable valve system may be controlled manually by an operator of the polarizer or by automated control, such as by a computer wherein a signal is sent to the controllable valve system such that valves of the controllable valve system may open or close.

In an embodiment of the present disclosure the controllable valve system comprises a pressure port for receiving a high-pressure gas ii) a vacuum port for receiving a low-pressure gas iii) a loading port for receiving media and/or the fluid vessel.

Preferably, each port of the controllable valve system has a controllable valve, for controlling the passage of fluids, such as liquids and/or gasses into and/or out from the reusable fluid path system of the polarizer.

The valves of the controllable valve system may be individually controlled such that the order and individual timing of passage of specific fluids and/or specific gasses into or out from the reusable fluid path system can be individually controlled.

The valve system may further comprise a loading chamber, which may have ports for connecting to a low-pressure source, a high-pressure source and means for connecting with the reusable fluid path system. Additionally, the loading chamber may comprise a loading chamber port, for introduction of media and/or media vessels.

The loading port of the controllable valve system may be used for introducing media and media vessels into the fluid path system. The media vessels may be connected to the reusable fluid path system. The loading port may be positioned on a loading chamber, comprising controllable valves.

The loading chamber may further be equipped with controllable valves for controlled transfer of fluids between different parts of, out from, and/or into the polarizer The low-pressure source may be a pump, such that a port of the controllable valve system is connected to a pump for evacuation of fluids.

The high-pressure gas may stem from a pressurized gas tank, such as a gas cylinder containing gas at a considerable high pressure. The high-pressure gas may be transferred into the reusable fluid path system depending on the configuration of the controllable valve system. The high-pressure gas may further be used as a driving pressure on media to be injected into the reusable fluid path system, such as by applying force on a syringe containing medium to be transferred into the reusable fluid path system.

In an embodiment of the present disclosure, the controllable valve system may have multiple ports for receiving multiple vessels containing media, which is to be introduced into the reusable fluid path system. The controllable valve system may comprise a single or multiple valves for controlling the transfer of liquids in and/or out of the reusable fluid path system. The pressure port and/or the vacuum port may have individual valves, and may further be separated from the media vessels by at least an additional valve.

In an embodiment of the present disclosure the high-pressure gas may be air or an inert gas, such as helium, with a substantially high pressure, such as at least 2 bar, preferably at least 7 bar, more preferably at least 12 bar, most preferably at least 16 bar.

In an embodiment of the present disclosure the low-pressure gas, is a gas, such as an inert gas, such as helium, having a substantially low pressure, such as an absolute pressure below 10 kPa, more preferably an absolute pressure below 1 kPa, even more preferably an absolute pressure below 100 Pa, yet more preferably an absolute pressure below 10 Pa, most preferably an absolute pressure below 1 Pa.

In an embodiment of the present disclosure, the pressure port and/or the vacuum port each comprise a sterile filter, such as a 0.2 µm pore size membrane sterile filter.

In an embodiment of the present disclosure, the fluid vessel containing the cleaning medium may be pre-pressurized to any absolute pressure up to 16 bar with helium gas, before injected the cleaning medium into the reusable fluid path system for cleaning.

In an embodiment of the present disclosure, the controllable valve system is controlled by a computer, having a memory and a processor, sending a signal to the controllable valve system such that valves are opened and/or closed. The computer may send a signal to the controllable valve system, such as based on the time elapsed since the procedure, such as the cleaning, was started.

The computer may in control the introduction media into and evacuation of media out from the reusable fluid path system. The computer may further have one or multiple input signals from one or multiple pressure sensors and/or one or multiple temperature sensors. Wherein the sensors may be positioned within the reusable fluid path system, on the reusable fluid path system, or in close proximity of the reusable fluid path system. At least parts of the sensors may be positioned within or on or in close proximity to the loading chamber and/or any one of the fluid vessels. At least parts of the pressure sensors being positioned such that there is a fluid connection between their position and the reusable fluid path system. The computer may further be used to control one or multiple heaters of the polarizer. The heaters which may be positioned within close proximity of the medium vessel. The computer may therefore control the heating of the medium, such as the cleaning medium, during a specific time point in the cleaning and/or polarization process.

DETAILED DESCRIPTION OF DRAWINGS

Figure 1:
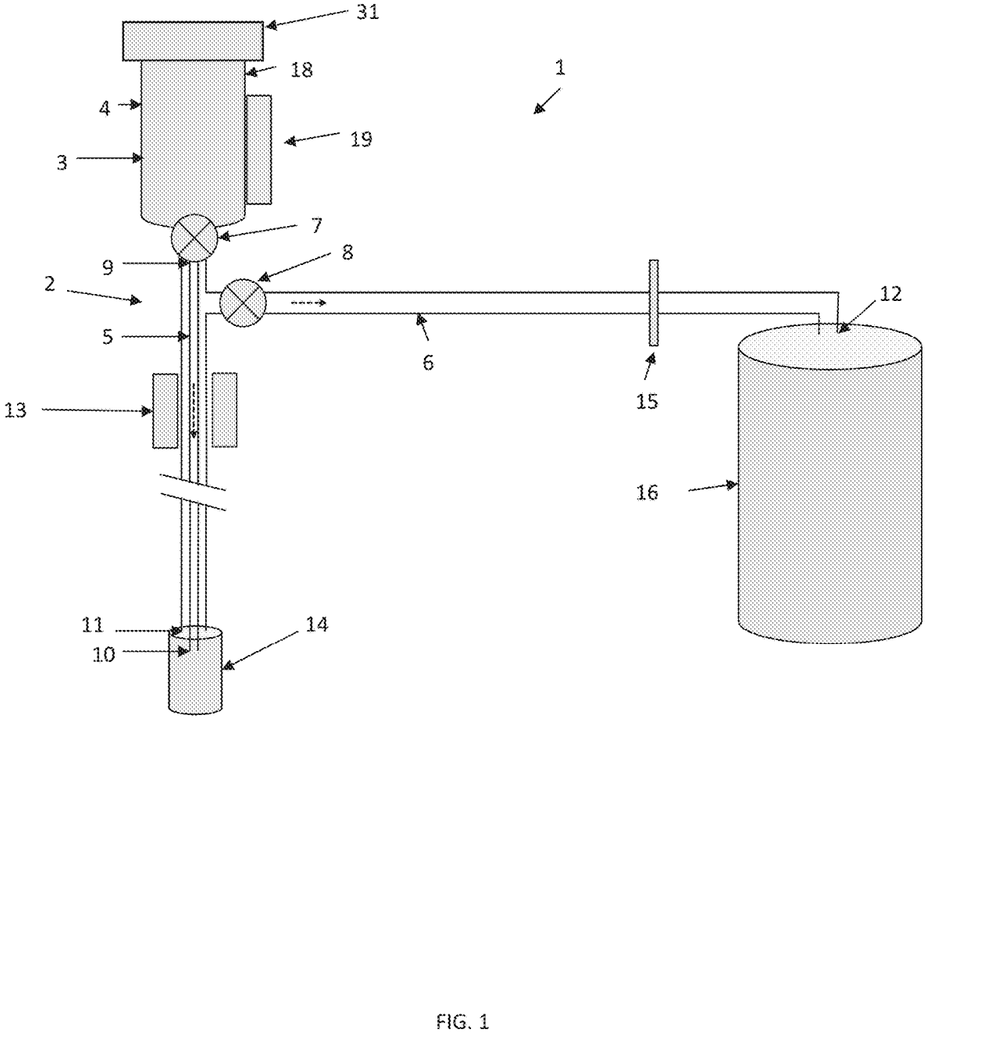
FIG. 1 shows a fluid path system comprising a reusable fluid path system. The sample vial being positioned on the opposite side of a dynamic seal with respect to the fluid vessel, containing fluid to be injected into the system, and the receiving vessel, according to an embodiment of the present disclosure.

FIG. 1 shows a fluid path system (1) comprising a reusable fluid path system (2), according to an embodiment of the present disclosure. The reusable fluid path system (2) is in fluid contact with a fluid vessel (18) for holding fluids to be injected into the reusable fluid path system (2). The fluid vessel (18) is in thermic contact with a heating system (19) for heating the fluid contained by the fluid vessel (18). The fluid vessel (18) is further provided with a pressure sensor (3) and a temperature sensor (4) for sensing the pressure and the temperature within the fluid vessel (18). Fluid may be introduced into the fluid vessel (18) through a controllable valve system (31) comprised of multiple connection ports, i) a pressure port for receiving a high-pressure gas ii) a vacuum port for receiving a low pressure gas, and iii) a loading port for receiving media and/or the fluid vessel. The reusable fluid path system (2) comprises an inlet tube (5) having a first inlet tube end (9) for fluid contact with a fluid vessel (18) and a second inlet tube end (10) configured for fluid contact with a sample vial (14), for holding the pharmaceutical product during hyperpolarization. The reusable fluid path system (2) additional comprises an outlet tube (6) having a first outlet tube end (11) configured for receiving the sample vial (14) and a second outlet tube end for connecting to a receiving vessel (16). The outlet tube (6) comprises an outlet tube filter (15), having a pore size of 0.2 µm for decreasing the bioburden of the final polarized pharmaceutical product. The inlet tube (5) is further equipped with an inlet valve (7) for controlling fluids within the reusable fluid path system (2). The outlet tube (6) comprises a similar arrangement as the inlet tube (5), with an outlet valve (8) positioned between the sample vial (14) and the outlet tube filter (15) for controlling fluids within the reusable fluid path system (2). The inlet tube (5) and the outlet tube (6) are, at least partly, coaxially confined, and in this part, they are bisected by a dynamic seal (13) which is positioned between the sample vial (14), the inlet valve (7) and the outlet valve (8). The dynamic seal allows the introduction of the sample vial (14) and parts of the reusable fluid path system (2) into a vacuum chamber of the polarizer without compromising the vacuum and/or the temperature conditions present. In this embodiment of the present disclosure, with a single connected fluid vessel (18), the liquids to be injected into the system, such as a cleaning medium during cleaning of the reusable fluid path system (2) and/or the dissolution medium for reconstituting a polarized pharmaceutical product, is injected into the fluid vessel through the loading port of the controllable valve system (31). The heating system (19) and the controllable valve system (31), connected to a vacuum source, such as a pump, and a pressure source, such as pressurized helium, may be controlled manually or automatically by a computer, wherein the temperature sensor (4) and the pressure sensor (3) may provide input into an automated feedback system.

Figure 2:
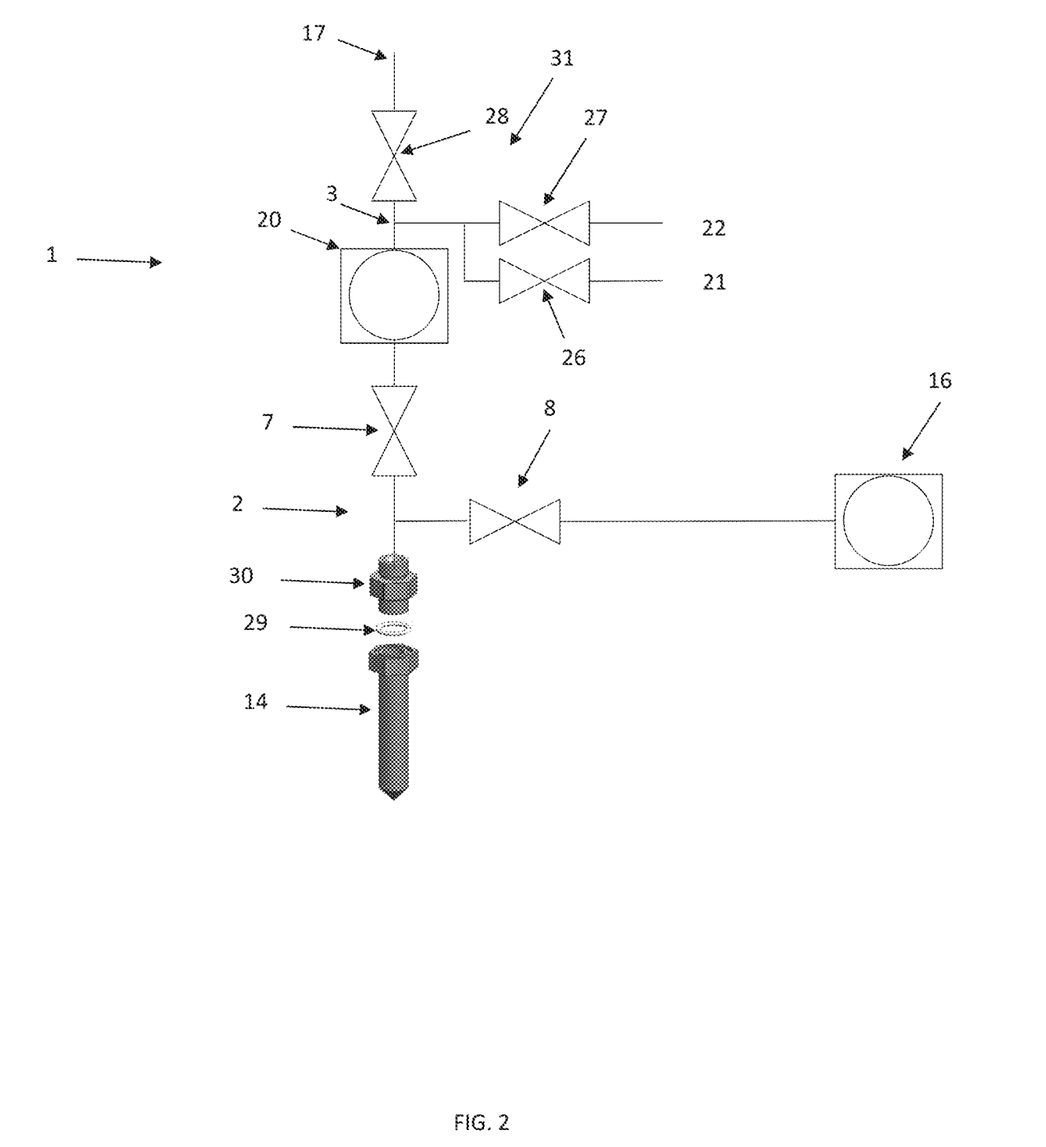
FIG. 2 shows a fluid path system comprising a reusable fluid path system, according to an additional embodiment of the present disclosure.

FIG. 2 shows a fluid path system (1) comprising a reusable fluid path system (1), according to an additional embodiment of the present disclosure. The fluid path system comprising an inlet tube and an outlet tube. The inlet tube being in fluid contact with the sample vial (14) and a fluid vessel with a heating system (20), said vessel being in contact with a controllable valve system (31) comprising i) a pressure port for receiving a high-pressure gas ii) a vacuum port for receiving a low pressure gas, and iii) a loading port for receiving media and/or a fluid vessel. The controllable valve system (31) further comprising a controllable vacuum valve (26) in fluid connection with the vacuum port (21), a controllable pressure valve (27) in fluid connection with the pressure port (22), where both the vacuum valve (26) and the pressure valve (27) may be operated manually or automatically by the use of a computer, such as in combination with the pressure sensor (3) and sensors of the heating system providing input the said computer such that signals controlling the heating system (20) and the controllable valve system (31) is generated. The sample may be connected to the reusable fluid path system (2), such as the first outlet tube end by the use of a sample adapter (30) which allows the sample vial (14) to be fitted onto the reusable fluid path system (2). A polytetrafluoroethylene (PTFE) O-ring (29) provides means for forming a hermetic seal between the adapter (30) positioned at the first outlet tube end (11) and the sample vial (14). The inlet tube and the outlet tube both contain valves which controlled the passage of fluids into different sections of the reusable fluid path system (2). A receiving vessel (16) is positioned at the second outlet tube end of the reusable fluid path system (2) for receiving the polarized pharmaceutical product. During cleaning, and pressure test a collector vessel and/or a stopper, such as a Luer stopper may instead be fluid connected to the second outlet tube end. The receiving vessel may comprise a sterile filter, such as a 0.22 μm membrane filter which is used for removing bioagents which may be present in the polarized product.

Figure 3A:
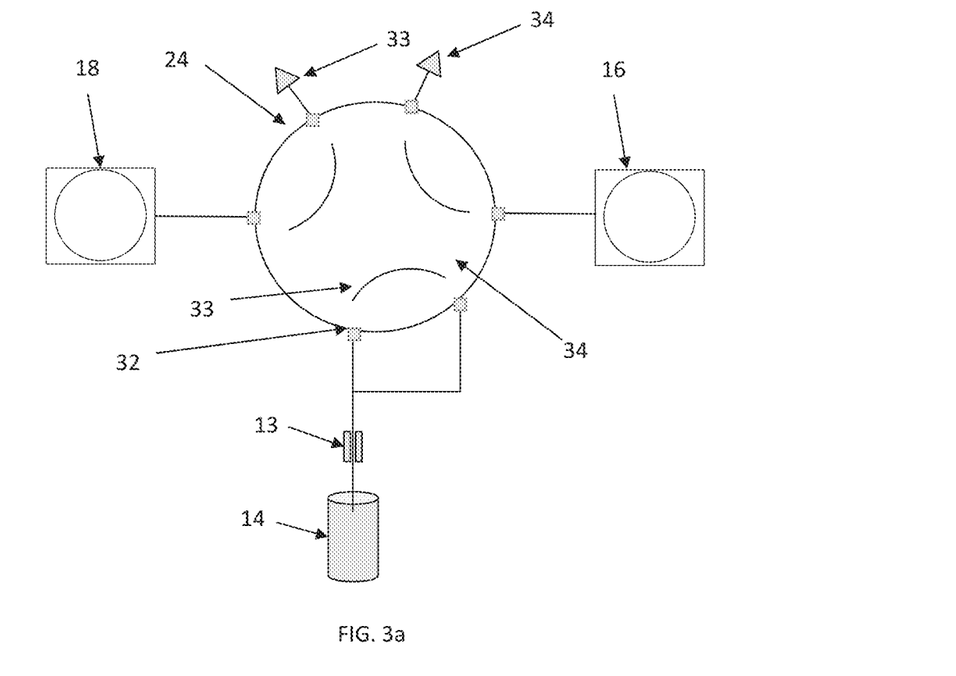
FIGS. 3a and 3b show a secondary controllable valve system positioned in fluid contact with the reusable fluid path system, switchable between a closed state and an open state, for controlling fluids within the reusable fluid path system.
Figure 3B:
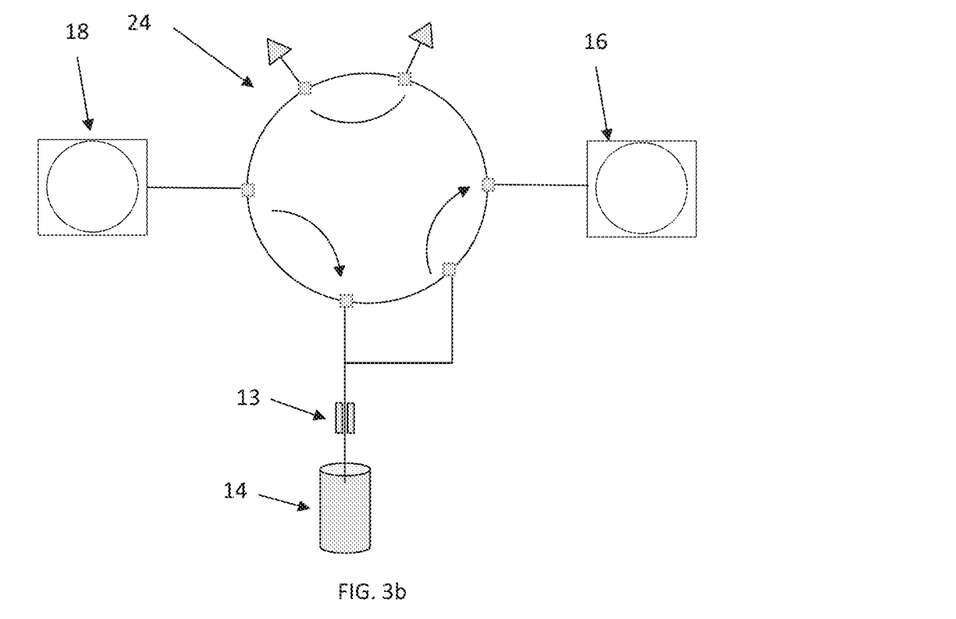

FIGS. 3a and 3b show a secondary controllable valve system (24), according to an additional embodiment of the present disclosure. The secondary controllable valve system (24) forms the inlet valve and the outlet valve, controlling the passage of fluids through the inlet tube and the outlet tube respectively. It is positioned between the fluid vessel (18), the receiving vessel (16) and the dynamic seal (13). Said valve system comprises six ports (32) for connecting to parts of the reusable fluid path system (2) and three fluid connectors (25) for connecting adjacent ports of the six ports of the secondary controllable valve system (31). The secondary controllable valve system being switchable between two states; 1. a closed state, FIG. 3a, wherein the valve is configured to prevent flow through the inlet tube and the outlet tube, while forming a fluid loop between the first outlet end and the second inlet end. 2. an open state, FIG. 3b, wherein there is a fluid connection between the first inlet tube end and the second inlet tube end, and a fluid connection between the first outlet tube end and the second outlet tube end. Switching between the two states of the secondary controllable valve system (24) is enabled by the rotation of the fluid connector plate (34), such that the fluid connectors (33) are moved one position. This switches the pairing of the six ports (32) such that the fluid can be allowed to enter the sample vial (14) in an open state of the secondary controllable valve system (24), and to be transferred from the sample vial (14) to the receiving vessel (16). Switching the closed state of the secondary valve system (24) the fluid entering the reusable fluid path system from the fluid vessel (18) is instead diverted to an inlet waste (33) wherein the injected liquid is discarded. Additionally the inlet waste may comprise a stopper such that flow is restricted. Similarly, the receiving vessel may be connected to an outlet waste (34) which may wither act to discard the fluid received, or comprise a stopper such that flow is restricted.

EXAMPLES

Example 1

Cleaning of a Reusable Fluid Path System and Polarization of a Pharmaceutical Product Using the Cleaned Reusable Fluid Path System Cleaning, comprising water for injection (WFI) and an ethanol solution as cleaning media used at different cleaning conditions, was carried out by the following cleaning cycle before the start of a polarization cycle. This was carried out multiple times (n=3) and the polarized pharmaceutical product was for each cycle received at the outlet in a sealed container.

Cleaning Cycle
  Seal the second inlet tube end with the first outlet tube end by connecting an empty vial
  Connect a collector vessel for collecting waste fluids
  Load 20 mL of water for injection (WFI) into the fluid vessel
  Heat the fluid vessel to 130° C.
  Open inlet tube valve for 30 s, then close
  Load 20 mL of 70% ethanol into fluid vessel
  Heat the fluid vessel to 80° C.
  Open inlet tube valve
  Remove collector vessel and add seal the second outlet tube end by the addition of a Luer stopper.
  Open the valve system to the low-pressure source for 5 min, then close.
  Open to helium gas (2 bar) for 10 s, then close.

Polarization Cycle
  Remove the empty vial and connect a sample vial holding the pharmaceutical product to the first outlet end of the reusable fluid path system
  Perform pressure test by introducing helium gas (2 bar) for 10 s and measure the pressure change during 60 s
  Insert sample vial into air lock and lower sample vial into the inside of the polarizer
  Start polarization of the pharmaceutical product
  Remove Luer stop and connect collector vessel for receiving the polarized pharmaceutical product
  Load 35 mL of WFI into fluid vessel
  When polarization of pharmaceutical product is completed (after around 30 min), heat WFI to 130° C.
  Open inlet and outlet valves, such that the pharmaceutical product can be reconstituted and the product can be transferred to the collector vessel The polarized pharmaceutical products was received in separate sealed collector vessels, for each cleaning and polarization cycle (n=3). The pharmaceutical product was tested according to standard practices for the presence of bacteria and endotoxins (lipopolysaccharides, LPS). Analysis showed that each of the polarized products contained a maximum of 5 CFU/mL.

Example 2

Measurements of Temperature and Pressure During a Cleaning Cycle

Figure 4:
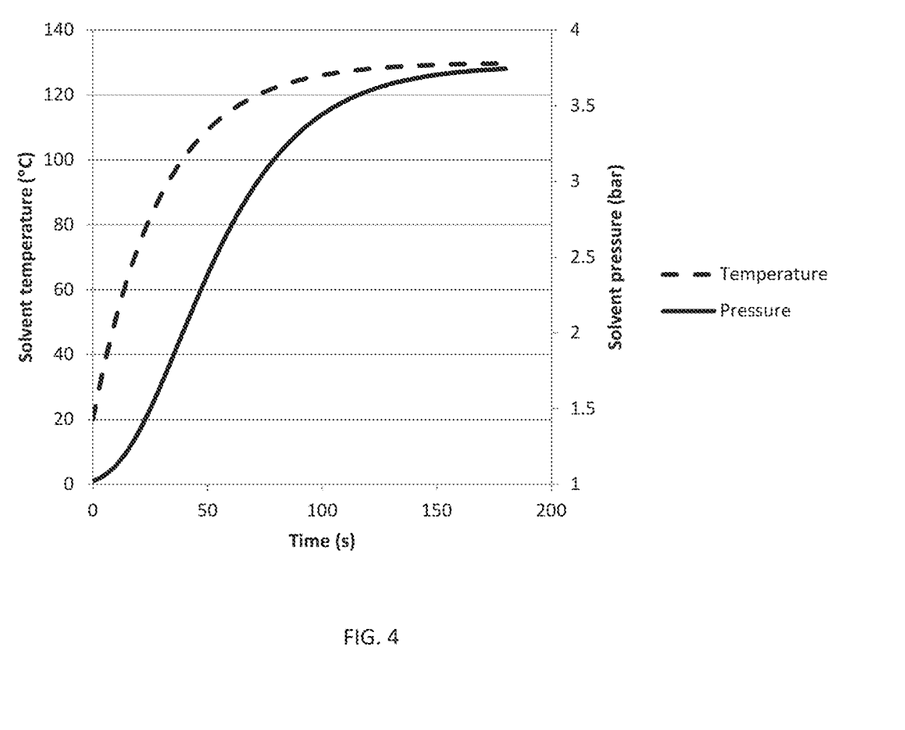
FIG. 4 shows an exemplary graph over temperature and pressure at the initial phase of a cleaning cycle, according to an embodiment of the present disclosure.

Temperature and pressure measurements were recorded during the initial phase of the cleaning cycle, according to an embodiment of the present disclosure. The temperature and pressure of the chosen cleaning medium, WFI, were registered during a time of 180 seconds. FIG. 4 shows the acquired data, which was measured at the position of the fluid vessel containing the WFI to be injected into the reusable fluid path system. The temperature shows a logarithmic increase over time, with an initially steep increase and thereafter stabilizing at 130° C. at the end of the measurement. The results of the pressure measurement, on the other hand displays a sigmoidal curve, stabilizing at an absolute pressure of around 3.75 bar at the end of the measurement.

The temperature and pressure combined with the cleaning medium may provide favorable cleaning conditions for reducing the bioburden of the reusable fluid path system. The cleaned reusable fluid path system may thereafter be suitable for polarization of a pharmaceutical product. The solvent vessel may be pre-pressurized to any pressure up to 16 bar with helium gas leading to a different pressure profile, but higher final pressure for cleaning or dissolution.

Items

1. A method for cleaning a reusable fluid path system for hyperpolarization of a pharmaceutical product, said reusable fluid path system being continuously at least partly contained by a polarizer; the method comprising the steps of
   providing the polarizer with an inlet tube having a first inlet tube end for fluid contact with a fluid vessel and a second inlet tube end configured for fluid contact with a vial, for holding the pharmaceutical product during hyperpolarization;
   providing the polarizer with an outlet tube having a first outlet tube end configured for receiving the vial and a second outlet tube end for connecting to a receiving vessel;
   sealing the second inlet tube end with the first outlet tube end;
   fluidly connecting a medium vessel to the first inlet tube end;
   fluidly connecting a collector vessel to the second outlet tube end;
   cleaning the reusable fluid path system by transferring a cleaning medium from the medium vessel into the reusable fluid path system;
   ejecting the cleaning medium from the reusable fluid path system into a collector vessel; and
   drying the reusable fluid path system.
2. The method according to item 1, wherein a combination of the cleaning medium and a number of cleaning parameters, comprising a minimum cleaning temperature, a minimum cleaning pressure and/or a minimum time period, is chosen such that a majority of the targeted biological agents, such as bacteria, can be assumed to be eliminated, removed, killed and/or deactivated, such that a low bioburden reusable fluid path system is achieved.
3. The method according to any of the preceding items, wherein the cleaning medium is in liquid and/or in gas phase, and selected from the group of water, bleach, chlorine, ethylene oxide, an aldehyde, a halogen-based biocide, a quaternary ammonium compound, a phenol, an acid solution, an alkali solution, a heavy metal solution, a solution containing surfactants, an alcohol, such as 70% ethanol in water, or a combination thereof.
4. The method according to any of the preceding items, wherein the cleaning medium is heated to the minimum temperature, such as at least 70° C., more preferably at least 90° C., even more preferably at least 110° C., most preferably at least 140° C.
5. The method according to any of the preceding items, wherein the cleaning medium is pressurized to the minimum pressure, such as at least 2 bar, more preferably at least 7 bar, more preferably at least 12 bar, most preferably at least 16 bar.
6. The method according to any of the preceding items, wherein at least a part of the cleaning medium is in the reusable fluid path system for the minimum time period, such as at least 1 minute, more preferably at least 5 minutes, even more preferably at least 10 minutes.
7. The method according to any of the preceding items, wherein the drying the reusable fluid path system comprises flushing the reusable fluid path system with a gas, such as air, nitrogen or helium.
8. The method according to any of items 1-[000155], wherein the drying of the reusable fluid path system comprises;
   evacuating the reusable fluid path system to a low pressure; and
   filling the reusable fluid path system with a gas, such as air, nitrogen or helium;
   wherein evacuating and filling of the reusable fluid path system can be carried out in any order and may be repeated a number of times.
9. The method according to any of the preceding items, wherein the reusable fluid path system following the drying is either sealed at a significantly low pressure, such as below 10 kPa, more preferably below 5 kPa, most preferably below 1 kPa or sealed after the introduction of an inert gas, such as helium, for preventing bacterial growth before and/or during polarization of a pharmaceutical product.
10. The method according to any of items [000168]-[000158], wherein the gas is sterile-filtered, such as by a 0.2 μm membrane filter.
11. The method according to any of the preceding items, wherein the method further comprises a pressure test of the reusable fluid path system, carried out before step f), before step h) and/or after step h), comprising;
   i. applying an initial pressure to the reusable fluid path system and sealing the reusable fluid path system;
   ii. measuring a pressure change in the reusable fluid path system during a specific time period; and
   iii. having a pass/fail-criterion such that the reusable fluid path system fails the pressure test if, during the specific time period, the absolute value of the pressure change is above a given tolerance value.
12. The method according to any of the preceding items, wherein sealing and/or connecting comprises hermetically sealing and/or hermetically connecting, such as by using a gasket or an O-ring of a material selected from the list including elastomers and polymers, such as a fluoropolymers, such as polytetrafluoroethylene (PTFE).
13. The method according to any of the preceding items, wherein the reusable fluid path system after cleaning meets governmental requirements, such as ISO 14937, ISO 11135, ISO 11737, ISO 17665, ISO 11138 and/or ISO 10993.
14. A method for hyperpolarizing a pharmaceutical product, comprising;
   a) cleaning a reusable fluid path system which is continuously at least partly contained by a polarizer;
   b) fluidly connecting a vessel containing a dissolution medium to the reusable fluid path system;
   c) fluidly connecting a vial containing a pharmaceutical product to the reusable fluid path system;
   d) polarizing the pharmaceutical product;
   e) fluidly connecting a receiving vessel;
   f) reconstituting the pharmaceutical product using the dissolution medium; and
   g) transferring the pharmaceutical product into the receiving vessel.
15. The method according to item 14, wherein the cleaning of the reusable fluid path system is performed according to the method of any of items 1-13.

16. The method according to any of items 14-15, wherein the reusable fluid path system is only used for hyperpolarization of a pharmaceutical product after it passes the pressure test.
17. The method according to any of items 14-16, wherein the receiving vessel and/or an outlet tube of the reusable fluid path system comprises a sterile filter, such as a 0.2 μm membrane filter, for decreasing the bioburden of the polarized product.
18. The method according to any of items 14-17, wherein cleaning of the reusable fluid path system is alternatively or additionally carried out after step g).
19. The method according to any of items 14-18, further comprising subjecting the pharmaceutical product and at least part of the fluid path system to electromagnetic radiation having a higher energy than visible light, such as ultraviolet (UV), during polarization of said pharmaceutical product, in order to kill any microorganisms present.
20. The method according to any of items 14-19, wherein the polarizer is surrounded by a laminar airflow of filtered air, such as by high efficiency particulate air (HEPA).
21. The method according to any of items 14-20, further accommodating a second cleaning step comprising cleaning of outer surfaces of the reusable fluid path system, cleaning of contacting parts, such as contacting parts of the fluid vessel, the collector vessel, the receiving vessel and/or the medium vessel, and/or cleaning of outer surfaces of the polarizer.
22. The method according to item 21, wherein the second cleaning step comprises cleaning with a second cleaning medium in liquid and/or in gas phase, and selected from the group of water, bleach, chlorine, ethylene oxide, an aldehyde, a halogen-based biocide, a quaternary ammonium compound, a phenol, an acid solution, an alkali solution, a heavy metal solution, a solution containing surfactants, an alcohol, such as 70% ethanol in water, or a combination thereof
23. A polarizer for hyperpolarizing a pharmaceutical product, accommodating a fluid path system comprising;
    a reusable fluid path system, being continuously at least partly contained by a polarizer, comprising;
        an inlet tube having a first inlet tube end for fluid contact with a fluid vessel and a second inlet tube end configured for fluid contact with a vial, for holding the pharmaceutical product during hyperpolarization;
        an outlet tube having a first outlet tube end configured for receiving the vial and a second outlet tube end for connecting to a receiving vessel;
    a heater for heating a cleaning medium;
    a controllable valve system having multiple connection ports, comprising i) a pressure port for receiving a high-pressure gas ii) a vacuum port for receiving a low pressure gas, and iii) a loading port for receiving media and/or the fluid vessel.
24. The polarizer according to item 23, configured for carrying out the method of any of items 1-22.
25. The polarizer according to any of items 23-24, wherein the high-pressure gas is a gas, such as air or an inert gas, such as helium, having a substantially high pressure, such as at least 2 bar, preferably at least 7 bar, more preferably at least 12 bar, most preferably at least 16 bar.
26. The polarizer according to any of items 23-25, wherein the low-pressure gas, is a gas, such as an inert gas, such as helium, having a substantially low pressure, such as below 10 kPa, more preferably below 1 kPa, even more preferably below 100 Pa, yet more preferably below 10 Pa, most preferably below 1 Pa.
27. The polarizer according to any of items 23-26, wherein the pressure port and the vacuum port each comprise a sterile filter, such as a 0.2 μm membrane filter.
28. The polarizer according to any of items 23-27, wherein one or multiple temperature sensors and/or one or multiple pressure sensors are used in order to measure the cleaning conditions within the reusable fluid path system, said pressure sensors and/or temperature sensors being positioned inside the reusable fluid path system, in contact with the reusable fluid path system, outside the reusable fluid path system, in the fluid vessel, in contact with the fluid vessel and/or outside the fluid vessel.
29. The polarizer according to any of items 23-28, wherein the reusable fluid path system may be detachable from the polarizer, such that the reusable fluid path system can be replaced or serviced.
30. The polarizer according to any of items 23-29, wherein the reusable fluid path system comprises a secondary controllable valve system, switchable between two states;
    an open state, where there is a fluid connection between the first inlet tube end and the second inlet tube end, and a fluid connection between the first outlet tube end and the second outlet tube end; and
    a closed state where the valve is configured to prevent flow in the inlet tube and the outlet tube, while forming a fluid loop between the first outlet end and the second inlet end.
31. The polarizer according to any of items 23-30, wherein the reusable fluid path system is permanently at least partly contained by the polarizer.
32. The polarizer according to any of items 23-31, further comprising a source for electromagnetic radiation having a higher energy than visible light, such as ultraviolet (UV), for ensuring a low bioburden of the polarized pharmaceutical product and/or the reusable fluid path system.

The invention claimed is:
1. A method for ensuring sterility or low bioburden of a reusable fluid path system for hyperpolarization of a pharmaceutical product, the fluid path system comprising an inlet tube having a first inlet tube end adapted for communicating with a fluid vessel and a second inlet tube end adapted for communicating with a vial, for holding the pharmaceutical product during hyperpolarization; and an outlet tube having a first outlet tube end configured for receiving the vial and a second outlet tube end for connecting to a receiving vessel, while said fluid path system is continuously at least partly contained by a polarizer during multiple consecutive uses; the method comprising:
    sealing the second inlet tube end with the first outlet tube end;
    fluidly connecting a medium vessel to the first inlet tube end;
    fluidly connecting a collector vessel to the second outlet tube end;
    transferring a cleaning medium from the medium vessel into the reusable fluid path and subjecting an inside of the reusable fluid path system to cleaning conditions selected for ensuring sterility or low bioburden;

ejecting the cleaning medium from the reusable fluid path system into a collector vessel; and drying the reusable fluid path system.

2. The method according to claim 1, wherein all parts that are to make contact with a dissolution medium or a pharmaceutical product during a hyperpolarization experiment, are subjected to cleaning conditions selected for ensuring sterility or low bioburden.

3. The method according to claim 1, wherein the fluid path system is not fluidly connected to a subject to which a hyperpolarized pharmaceutical product is to be injected.

4. The method according to claim 1, wherein the cleaning medium or a number of cleaning parameters, comprising a minimum cleaning temperature, a minimum cleaning pressure or a minimum time period, is chosen such that a majority of the targeted biological agents are eliminated, removed, killed or deactivated, such that a low bioburden reusable fluid path system is achieved.

5. The method according to claim 4, wherein the cleaning medium is in liquid or in gas phase, and selected from the group of water, bleach, chlorine, ethylene oxide, an aldehyde, a halogen-based biocide, a quaternary ammonium compound, a phenol, an acid solution, an alkali solution, a heavy metal solution, a solution containing surfactants, an alcohol or 70% ethanol in water, or a combination thereof.

6. The method according to claim 4, wherein the cleaning medium is heated to the minimum temperature of at least 70° C. or at least 90° C., or at least 110° C., or at least 140° C.

7. The method according to claim 4, wherein the cleaning medium is pressurized to the minimum pressure of at least 2 bar or at least 7 bar or at least 12 bar, or at least 16 bar.

8. The method according to claim 4, wherein at least a part of the cleaning medium is in the reusable fluid path system for the minimum time period of at least 1 minute, or at least 5 minutes, or at least 10 minutes.

9. The method according to claim 1, wherein the step of drying of the reusable fluid path system comprises flushing the reusable fluid path system with a gas, or air, or nitrogen or helium.

10. The method according to claim 1, wherein the drying of the reusable fluid path system comprises;

evacuating the reusable fluid path system to a low pressure; and filling the reusable fluid path system with a gas, or air, or nitrogen or helium;

wherein evacuating and filling of the reusable fluid path system may be carried out in any order and may be repeated at least once.

11. The method according to claim 1, wherein the reusable fluid path system following the drying is either sealed at a significantly low pressure, below 10 kPa, or below 5 kPa, or below 1 kPa or sealed after the introduction of an inert gas, or helium, for preventing bacterial growth before or during polarization of a pharmaceutical product.

12. The method according to claim 1, wherein the method further comprises a pressure test of the reusable fluid path system, carried out before the step of transferring a cleaning medium the reusable fluid path system, before drying the reusable fluid path system or after drying the reusable fluid path system, comprising;

i. applying an initial pressure to the reusable fluid path system and sealing the reusable fluid path system;

ii. measuring a pressure change in the reusable fluid path system during a specific time period; and iii. having a pass/fail-criterion such that the reusable fluid path system fails the pressure test if, during the specific time period, the absolute value of the pressure change is above a given tolerance value.

13. A method for hyperpolarizing a pharmaceutical product using a reusable fluid path system mounted to a polarizer, the method comprising;

a) providing a vial for holding the pharmaceutical product during hyperpolarization and a receiving vessel for receiving a hyperpolarized pharmaceutical product;

b) sterilizing or ensuring low bioburden of the reusable fluid path system according to the method of claim 1;

c) fluidly connecting a vessel containing a dissolution medium to the reusable fluid path system;

d) fluidly connecting a vial containing a pharmaceutical product to the reusable fluid path system;

e) polarizing the pharmaceutical product;

f) fluidly connecting a receiving vessel to an outlet end of the reusable fluid path system, such as the second outlet tube end;

g) dissolving the pharmaceutical product using the dissolution medium; and h) transferring the pharmaceutical product into the receiving vessel.

14. The method according to claim 13, wherein the pharmaceutical product, once transferred into the receiving vessel, is ready for injection into a subject, by having a sufficiently high polarization, a sufficiently low bioburden, and a sufficient amount of the pharmaceutical product.

15. The method according to claim 13, further comprising subjecting the pharmaceutical product and at least part of the fluid path system to electromagnetic radiation having a higher energy than visible light, during polarization of said pharmaceutical product, in order to kill any microorganisms present.

16. The method according to claim 13, wherein the polarizer is located in a stream of filtered air, comprising high efficiency particulate air (HEPA).

* * * * *